(12) United States Patent
Yin

(10) Patent No.: US 11,444,103 B2
(45) Date of Patent: Sep. 13, 2022

(54) ARRAY SUBSTRATE AND METHOD OF MANUFACTURING THEREOF

(71) Applicant: Wuhan China Star Optoelectronics Technology Co., Ltd., Hubei (CN)

(72) Inventor: Bingkun Yin, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 184 days.

(21) Appl. No.: 16/637,873

(22) PCT Filed: Nov. 8, 2019

(86) PCT No.: PCT/CN2019/116445
§ 371 (c)(1),
(2) Date: Feb. 10, 2020

(87) PCT Pub. No.: WO2021/031381
PCT Pub. Date: Feb. 25, 2021

(65) Prior Publication Data
US 2022/0037372 A1  Feb. 3, 2022

(30) Foreign Application Priority Data
Aug. 20, 2019 (CN) .......................... 201910768489.X

(51) Int. Cl.
*H01L 27/00* (2006.01)
*H01L 27/12* (2006.01)

(52) U.S. Cl.
CPC ...... *H01L 27/1225* (2013.01); *H01L 27/1259* (2013.01)

(58) Field of Classification Search
CPC ............. H01L 27/1225; H01L 27/1259; H01L 27/3258; H01L 27/1248; H01L 27/1218; H01L 27/3279
See application file for complete search history.

(56) References Cited

U.S. PATENT DOCUMENTS

| | | | |
|---|---|---|---|
| 9,869,912 B2 * | 1/2018 | Xu | G02F 1/1368 |
| 9,947,735 B2 * | 4/2018 | Jeon | H01L 27/127 |
| 10,802,309 B2 * | 10/2020 | Cao | H01L 27/3276 |
| 2017/0092708 A1 * | 3/2017 | Jeon | H01L 27/127 |
| 2018/0351118 A1 | 12/2018 | Nakaie | |
| 2019/0324312 A1 * | 10/2019 | Cao | G02F 1/136286 |
| 2020/0185423 A1 | 6/2020 | Hu | |
| 2020/0194469 A1 | 6/2020 | Hu | |

FOREIGN PATENT DOCUMENTS

| | | |
|---|---|---|
| CN | 108878482 A | 11/2018 |
| CN | 109659320 A | 4/2019 |
| CN | 109659337 A | 4/2019 |
| CN | 109671719 A | 4/2019 |
| CN | 109887928 A | 6/2019 |
| JP | 2004152984 A | 5/2004 |

* cited by examiner

*Primary Examiner* — Nikolay K Yushin
(74) *Attorney, Agent, or Firm* — Luedeka Neely Group, PC

(57) ABSTRACT

An array substrate and a method of manufacturing thereof are provided. The array substrate includes a substrate, a buffer layer, a plurality of thin film transistors, an organic layer, and a first electrode. By defining a via hole between two adjacent thin film transistors in the bending region, the via hole penetrates through the passivation layer, the gate insulating layer, and the first metal trace, which can effectively reduce stress between the passivation layer and the gate insulating layer.

10 Claims, 1 Drawing Sheet bending region 120

ARRAY SUBSTRATE AND METHOD OF MANUFACTURING THEREOF

BACKGROUND OF INVENTION

Field of Invention

The present invention relates to the field of display technology, and more particularly, to an array substrate and a method of manufacturing thereof.

Description of Prior Art

Compared with flat displays, curved displays have a wider viewing angle, which can reduce distortion because of close viewing, and can achieve the differentiation of display products. However, the film stress is larger when the display screen is bent. Currently, it is easy for films to break and to affect the display effect when the display screen is bent.

Since film metal traces, insulating layers, and transparent electrodes disposed on sides of the array substrate are brittle inorganic materials, and liquid crystal display screens are bent with a small curvature radius, it is easy for liquid crystal display screens to break and affect the display effect. In particular, the breakage of the metal traces may cause defects such as bright lines or dark lines, which affects the display quality of the array substrate.

Therefore, it is an urgent need to provide a new array substrate and a method of manufacturing the array substrate to reduce stress when the array substrate is bent, thereby improving the reliability of the array substrate.

SUMMARY OF INVENTION

An object of the present invention is to provide an array substrate and a method of manufacturing thereof. By defining at least one via hole between adjacent thin film transistors in a bending region, each of the via holes penetrates through the thin film transistor, and can effectively reduce stress between the inorganic layers. The stress is reduced when the array substrate is bent, thereby improving the reliability of the array substrate.

An array substrate comprises a display region and at least one bending region. The array substrate comprises:
a substrate;
a buffer layer disposed on the substrate;
a thin film transistor layer disposed on the buffer layer away from the substrate, and the thin film transistor layer comprises a first metal trace, a plurality of thin film transistors are formed in the thin film transistor layer, at least one via hole is defined between two adjacent thin film transistors, and the via hole penetrates through the first metal trace to a surface of the buffer layer; and an organic layer disposed on the thin film transistor layer, wherein the via hole is filled with the organic layer, and the via hole corresponds to the bending region.

In one embodiment, material of the organic layer comprises a photoresist, and material of the buffer layer comprises silicon nitride or silicon oxide.

In one embodiment, the first metal trace is disposed on a side of the buffer layer away from the substrate, and the thin film transistor layer further comprises:
a gate insulating layer disposed on the first metal trace;
a semiconductor layer disposed on a side of the gate insulating layer away from the first metal trace;
a second metal trace disposed on the semiconductor layer and the gate insulating layer; and a passivation layer disposed on the second metal trace, the semiconductor layer, and the gate insulating layer.

In one embodiment, the first metal trace comprises a plurality of hollow holes, and the plurality of hollow holes are defined by the via hole penetrating the first metal trace.

In one embodiment, a shape of each of the hollow holes comprises a circle or a square, and the hollow holes are evenly distributed on the first metal trace.

In one embodiment, a diameter of each of the hollow holes is 3 to 5 µm.

In one embodiment, the substrate comprises a glass substrate and a transparent base layer, and the transparent base layer is disposed on a side of the glass substrate close to the buffer layer.

In one embodiment, material of the semiconductor layer comprises indium gallium zinc oxide, the second metal trace comprises a source trace and a drain trace, and the source trace and the drain trace are respectively connected to the semiconductor layer.

In one embodiment, the array substrate further comprises a first electrode, and the first electrode is disposed on the organic layer, and the first electrode is connected to the second metal trace.

A method of manufacturing an array substrate comprises following steps:
providing a glass substrate, wherein a transparent base layer is coated on the glass substrate, a substrate is formed through pre-baking and solid-baking, and the substrate comprises at least one bending region and a display region; depositing a buffer layer on the substrate; depositing a first metal trace on a side of the buffer layer away from the substrate; depositing a gate insulating layer on the first metal trace; depositing a semiconductor layer on a side of the gate insulating layer away from the first metal trace; depositing a second metal trace on the semiconductor layer and the gate insulating layer; depositing a passivation layer on the second metal trace, the semiconductor layer, and the gate insulating layer; defining at least one via hole in the bending region, wherein the at least one via hole penetrates through the passivation layer, the gate insulating layer, and the first metal trace to a surface of the buffer layer; depositing an organic layer on the passivation layer and in the via hole; and depositing a first electrode on the organic layer, wherein the first electrode is connected to the second metal trace.

A via hole is defined between two adjacent thin film transistors in the bending region, and the via hole penetrates through the passivation layer, the gate insulating layer, and the first metal trace. The stress of the passivation layer and the gate insulating layer can be effectively relieved. At the same time, the hollow hole is defined on the first metal trace perpendicular to the bending direction, the hollow hole is defined by the via hole penetrating the first metal trace, and the hollow hole is filled with the organic layer. The hollow hole is with the organic layer. The organic layer can effectively block the crack propagation in the metal traces, which reduces the risk of the breakage of the entire first metal trace.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

Figure 1:
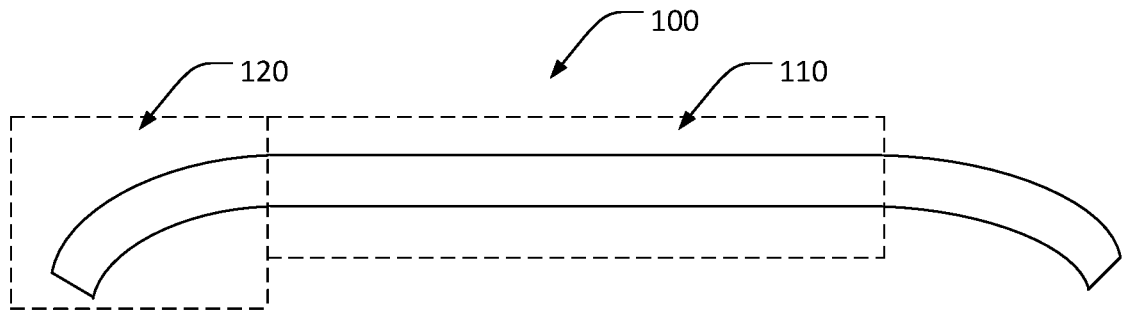
FIG. 1 is a schematic view of an array substrate according to one embodiment of the present invention.

Reference Numerals:

array substrate 100; display region 110; bending region 120; substrate 101; buffer layer 102; thin film transistor layer 103; organic layer 104; first electrode 105; glass substrate 1011; transparent base layer 1012; first metal trace 1031; gate insulating layer 1032; semiconductor layer 1033; second metal trace 1034; passivation layer 1035; via hole 106; hollow hole 1031a; and thin film transistor 107.

DETAILED DESCRIPTION OF PREFERRED EMBODIMENTS

The following is a description of each embodiment with reference to additional drawings to illustrate specific embodiments of the present invention. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof.

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

Referring to FIG. 1, an array substrate 100 is provided. The array substrate 100 may be a curved display. The array substrate 100 comprises a display region 110 and a bending region 120. Both the display region 110 and the bending region 120 can perform screen display.

In one embodiment, the array substrate 100 comprises two bending regions 120, and the display region 110 is disposed between the two bending regions 120. The array substrate 100 can perform curved display, has a wider viewing angle, and can reduce the distortion of close viewing.

Figure 2:
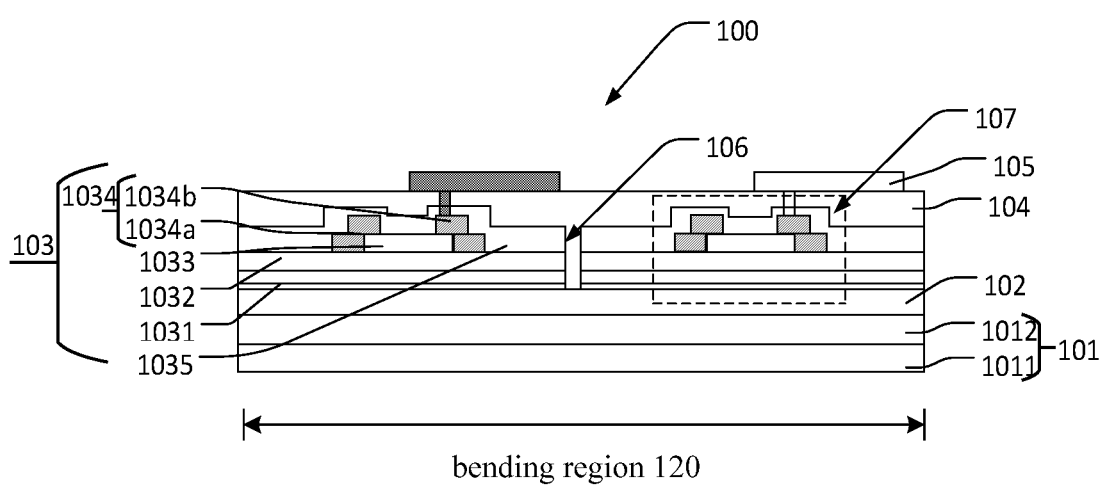
FIG. 2 is a cross-sectional view of an array substrate according to one embodiment of the present invention.

Referring to FIG. 2, the array substrate 100 comprises a substrate 101, a buffer layer 102, a plurality of thin film transistors 103, an organic layer 104, and a first electrode 105.

The substrate 101 comprises a glass substrate 1011 and a transparent base layer 1012.

The transparent base layer 1012 is disposed on a side of the glass substrate 1011 close to the buffer layer 102. The material of the transparent base layer 1012 is polyimide.

The glass substrate 1011 is coated by a polyimide solution on the glass substrate 1011, and then it is pre-baking and solid-baking to form a substrate 101.

The buffer layer 102 is disposed on the substrate 101. Material of the buffer layer 102 comprises silicon nitride or silicon oxide. The buffer layer 102 is formed by a chemical vapor deposition.

The buffer layer 102 is disposed on the substrate 101; a material of the buffer layer 102 includes silicon nitride or silicon oxide. The buffer layer 102 is formed by a chemical vapor deposition method.

The thin film transistor layer 103 is disposed on the buffer layer 102 away from the substrate 101. A plurality of thin film transistors 107 are formed in the thin film transistor layer 103. At least one via hole 106 is defined between two adjacent thin film transistors 107 in the bending region 120. The via hole 106 penetrates through the first metal trace 1031 of the thin film transistor layer 107 to a surface of the buffer layer 102. The via hole 106 corresponds to the bending region 120.

The thin film transistor layer 103 comprises a first metal trace 1031, a gate insulating layer 1032, a semiconductor layer 1033, a second metal trace 1034, and a passivation layer 1035.

The first metal trace 1031 is disposed on a side of the buffer layer 102 away from the substrate 101. The first metal trace 1031 is formed by physical vapor deposition, and a patterned first metal trace 1031 is formed through exposure, development, and etching processes.

Figure 3:
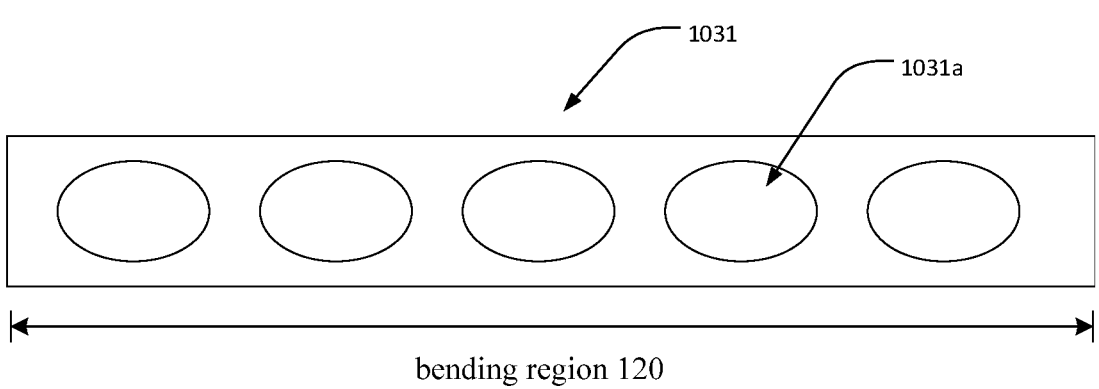
FIG. 3 is a schematic view of a first metal trace according to one embodiment of the present invention.

Referring to FIG. 3, in the bending area 120, the first metal trace 1031 comprises a plurality of hollow holes 1031a.

A shape of each of the hollow holes 1031a comprises a circle or a square, and the hollow holes 1031a are evenly distributed on the first metal trace 1031. The plurality of hollow holes 1031a are defined by the via hole 106 penetrating the first metal trace 1031.

In one embodiment, the hollow holes 1031a have a circular shape, and is distributed in a single row on the first metal trace 1031. The number of the hollow holes 1031a is not limited. A diameter of the hollow holes 1031a is 3 to 5 μm. The greater the diameter of the hollow hole 1031a is, the more material is filled in the organic layer, and thus the bending region 120 can withstand greater stress.

A gate insulating layer 1032 is disposed on the first metal trace 1031. The gate insulating layer 1032 is formed by chemical vapor deposition.

The semiconductor layer 1033 is disposed on a side of the gate insulating layer 1032 away from the first metal trace 1031. Material of the semiconductor layer 1033 is indium gallium zinc oxide.

The semiconductor layer 1033 is formed by physical vapor deposition, and a patterned semiconductor layer 1033 is formed through exposure, development, and etching processes.

The second metal trace 1034 is disposed on the semiconductor layer 1033 and the gate insulating layer 1032. The second metal trace 1034 comprises a source trace and a drain trace. The source trace and the drain trace are respectively connected to the semiconductor layer 1033.

The second metal trace 1034 is formed by physical vapor deposition, and a patterned second metal trace 1034 is formed through exposure, development, and etching processes.

The passivation layer 1035 is disposed on the second metal trace 1034, the semiconductor layer 1033, and the gate insulating layer 1032.

The passivation layer 1035 is formed by chemical vapor deposition, and then is exposed, developed, and etched.

The organic layer 104 is disposed on the thin film transistor layer 103, and the via hole 106 is filled with the organic layer 104. Material of the organic layer 104 is an organic photoresist.

The organic layer 104 is formed by slit coating. The via hole 106 is filled with the organic layer 104, and a patterned organic layer 104 is formed through exposure, development, baking, and ashing.

The first electrode 105 is disposed on the organic layer 104, and the first electrode 105 is connected to the second metal trace 1034. The material of the first electrode 105 is indium tin oxide.

The first electrode 105 is formed by physical vapor deposition, and a pattern first electrode 105 is formed through exposure, development, and etching.

A via hole 106 is defined between two adjacent thin film transistors 107 in the bending region 120, and the via hole 106 penetrates through the passivation layer 1035, the gate insulating layer 1032, and the first metal trace 1031. The stress of the passivation layer 1035 and the gate insulating layer 1032 can be effectively relieved. At the same time, the hollow holes 1031a are defined on the first metal trace 1031 perpendicular to the bending direction, the hollow holes 1031a are defined by the via hole 106 penetrating the first metal trace, and the hollow holes 1031a are filled with the organic layer 104. The organic layer 104 can effectively block the crack propagation in the metal traces, and reduce the risk of the breakage of the entire first metal trace.

Referring to FIG. 2, a method of manufacturing an array substrate is provided. The method of manufacturing an array substrate comprises following steps S1 to S6.

Step S1, providing a glass substrate 1011, and a transparent base layer 1012 is coated on the glass substrate 1011, and a substrate 101 is formed through pre-baking and solid-baking, and the substrate comprises a display region 110 and at least one bending region 120.

Step S2, depositing a buffer layer 102 on the substrate 101. The material of the buffer layer 102 comprises silicon nitride or silicon oxide. The buffer layer 102 is deposited by a chemical vapor deposition.

Step S3, depositing a first metal trace 1031 on the buffer layer 102. The first metal trace 1031 is formed by physical vapor deposition, and a patterned first metal trace 1031 is formed through exposure, development, and etching processes.

Step S4, depositing a gate insulating layer 1032 on the first metal trace 103. The gate insulating layer 1032 is formed by chemical vapor deposition.

Step S5, depositing a semiconductor layer 1033 on a side of the gate insulating layer 1032 away from the first metal trace 1031. The semiconductor layer 1033 is formed by a physical vapor deposition, and a patterned semiconductor layer 1033 is formed through exposure, development, and etching processes.

Step S6, depositing a second metal trace 1034 on the semiconductor layer 1033 and the gate insulating layer 1032. The second metal trace 1034 is formed by physical vapor deposition, and a patterned second metal trace 1034 is formed through exposure, development, and etching processes.

Step S7, depositing a passivation layer 1035 on the second metal trace 1034, the semiconductor layer 1033, and the gate insulating layer 1032. The passivation layer 1035 is formed by chemical vapor deposition, and then is exposed, developed, and etched.

Step S8, as shown in FIG. 3, defining at least one via hole 103 in the bending region 120, and the at least one via hole 106 penetrates through the passivation layer 1035, the gate insulating layer 1032, and the first metal trace 1031 to a surface of the buffer layer 102.

The first metal trace 1031 comprises a plurality of hollow holes 1031a in the bending region 120.

A shape of each of the hollow holes 1031a comprises a circle or a square, and the hollow holes 1031a are evenly distributed on the first metal trace 1031. The plurality of hollow holes 1031a are defined by the via hole 103 penetrating the first metal trace 1031.

Step S9, forming an organic layer 104 on the passivation layer 1035 and in the via hole 106. The organic layer 104 is formed by slit coating. The via hole 106 is filled with the organic layer 104, and a patterned organic layer 104 is formed through exposure, development, baking, and ashing.

Step S10, depositing a first electrode 105 on the organic layer 104. The first electrode 105 is connected to the second metal trace 1034. The first electrode 105 is formed by physical vapor deposition, and a patterned first electrode 105 is formed through exposure, development, and etching.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An array substrate, comprising a display region and at least one bending region, wherein the array substrate comprises:
    a substrate
    a buffer layer disposed on the substrate;
    a thin film transistor layer disposed on the buffer layer away from the substrate, wherein the thin film transistor layer comprises a first metal trace, a plurality of thin film transistors are formed in the thin film transistor layer, and wherein in the at least one bending region, the array substrate further comprises at least one via hole and two adjacent thin film transistors, the at least one via hole is defined between the two adjacent thin film transistors, and the via hole penetrates through the first metal trace to a surface of the buffer layer; and
    an organic layer disposed on the thin film transistor layer, wherein the via hole is filled with the organic layer, and the via hole corresponds to the bending region.

2. The array substrate according to claim 1, wherein material of the organic layer comprises a photoresist, and material of the buffer layer comprises silicon nitride or silicon oxide.

3. The array substrate according to claim 1, wherein the substrate comprises a glass substrate and a transparent base layer, and the transparent base layer is disposed on a side of the glass substrate close to the buffer layer.

4. The array substrate according to claim 1, wherein the first metal trace is disposed on a side of the buffer layer away from the substrate, and the thin film transistor layer further comprises:
    a gate insulating layer disposed on the first metal trace;
    a semiconductor layer disposed on a side of the gate insulating layer away from the first metal trace;
    a second metal trace disposed on the semiconductor layer and the gate insulating layer; and
    a passivation layer disposed on the second metal trace, the semiconductor layer, and the gate insulating layer.

5. The array substrate according to claim 4, wherein material of the semiconductor layer comprises indium gallium zinc oxide, the second metal trace comprises a source trace and a drain trace, and the source trace and the drain trace are respectively connected to the semiconductor layer.

6. The array substrate according to claim 4, further comprising a first electrode, wherein the first electrode is disposed on the organic layer, and the first electrode is connected to the second metal trace.

7. The array substrate according to claim 1, wherein the first metal trace comprises a plurality of hollow holes, and the plurality of hollow holes are defined by the via hole penetrating the first metal trace.

8. The array substrate according to claim 7, wherein a shape of each of the hollow holes comprises a circle or a square, and the hollow holes are evenly distributed on the first metal trace.

9. The array substrate according to claim 7, wherein a diameter of each of the hollow holes is 3 to 5 μm.

10. A method of manufacturing an array substrate, comprising following steps:
- providing a glass substrate, wherein a transparent base layer is coated on the glass substrate, a substrate is formed through pre-baking and solid-baking, and the substrate comprises at least one bending region and a display region;
- depositing a buffer layer on the substrate;
- depositing a first metal trace on a side of the buffer layer away from the substrate;
- depositing a gate insulating layer on the first metal trace;
- depositing a semiconductor layer on a side of the gate insulating layer away from the first metal trace;
- depositing a second metal trace on the semiconductor layer and the gate insulating layer;
- depositing a passivation layer on the second metal trace, the semiconductor layer, and the gate insulating layer;
- defining at least one via hole and two adjacent thin film transistors in the bending region, wherein the at least one via hole is defined between the two adjacent thin film transistors, and the at least one via hole penetrates through the passivation layer, the gate insulating layer, and the first metal trace to a surface of the buffer layer;
- depositing an organic layer on the passivation layer and in the via hole; and
- depositing a first electrode on the organic layer, wherein the first electrode is connected to the second metal trace.

* * * * *